(12) United States Patent
Togo et al.

(10) Patent No.: US 10,325,824 B2
(45) Date of Patent: Jun. 18, 2019

(54) METHODS, APPARATUS AND SYSTEM FOR THRESHOLD VOLTAGE CONTROL IN FINFET DEVICES

(71) Applicant: GLOBALFOUNDRIES INC., Grand Cayman (KY)

(72) Inventors: Mitsuhiro Togo, Burnt Hills, NY (US); Ram Asra, Clifton Park, NY (US); Xing Zhang, Beacon, NY (US); Palanivel Balasubramaniam, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/622,061

(22) Filed: Jun. 13, 2017

(65) Prior Publication Data

US 2018/0358272 A1 Dec. 13, 2018

(51) Int. Cl.
| | |
|---|---|
| *H01L 21/66* | (2006.01) |
| *H01L 21/8238* | (2006.01) |
| *H01L 27/092* | (2006.01) |
| *H01L 29/10* | (2006.01) |
| *H01L 29/423* | (2006.01) |

(52) U.S. Cl.
CPC ........ *H01L 22/20* (2013.01); *H01L 21/82385* (2013.01); *H01L 21/823807* (2013.01); *H01L 21/823821* (2013.01); *H01L 27/0922* (2013.01); *H01L 27/0924* (2013.01); *H01L 29/1037* (2013.01); *H01L 29/42376* (2013.01)

(58) Field of Classification Search
CPC ............ H01L 22/20; H01L 21/823807; H01L 21/823821; H01L 27/0922; H01L 21/82385; H01L 29/42376; H01L 29/1037; H01L 27/0924
See application file for complete search history.

(56) References Cited

U.S. PATENT DOCUMENTS

| | | | |
|---|---|---|---|
| 6,373,111 B1* | 4/2002 | Zheng | H01L 21/823425 257/407 |
| 7,895,550 B2* | 2/2011 | Walker | H01L 27/0207 703/13 |
| 8,530,976 B1 | 9/2013 | Ratnakumar et al. | |
| 8,653,605 B2* | 2/2014 | Carter | H01L 21/823842 257/369 |
| 8,673,731 B2* | 3/2014 | Chang | H01L 21/823842 257/347 |
| 8,722,491 B2 | 5/2014 | Park et al. | |
| 9,190,488 B1 | 11/2015 | Park et al. | |

(Continued)

*Primary Examiner* — Matthew L Reames
*Assistant Examiner* — Benjamin T Liu
(74) *Attorney, Agent, or Firm* — Williams Morgan, P.C.

(57) ABSTRACT

At least one method, apparatus and system are disclosed for controlling threshold voltage values for a plurality of transistor devices. Determine a first threshold voltage of a first transistor gate comprising a first gate channel having a first length. Determine a second length of a second gate channel of a second transistor gate. Determining a process adjustment of the second gate based on the second length for providing a second threshold voltage of the second transistor gate. The second threshold voltage is within a predetermined range of the first threshold voltage. Provide data relating to process adjustment to a process controller for performing the process adjustment.

10 Claims, 9 Drawing Sheets

(56) References Cited

U.S. PATENT DOCUMENTS

| | | | |
|---|---|---|---|
| 2007/0052037 A1* | 3/2007 | Luan | H01L 21/823821 257/369 |
| 2015/0017746 A1* | 1/2015 | Yu | H01L 21/823412 438/10 |
| 2015/0145592 A1* | 5/2015 | Li | H01L 27/0705 327/537 |
| 2015/0262828 A1 | 9/2015 | Brand et al. | |

* cited by examiner

METHODS, APPARATUS AND SYSTEM FOR THRESHOLD VOLTAGE CONTROL IN FINFET DEVICES

BACKGROUND OF THE INVENTION

Field of the Invention

Generally, the present disclosure relates to the manufacture of sophisticated semiconductor devices, and, more specifically, to various methods for providing threshold voltage control for finFET devices.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art FinFET device. A FinFET device 100 illustrated in FIG. 1 comprises a plurality of "fins" 110. The semiconductor device may be position to a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled T) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

There is a push to scale down integrated circuits to support ever-shrinking electronic devices. This has prompted designers to reduce the size of finFET devices. As such, the pitch of the fin in finFET devices is reduced, increasing the density of finFET devices. As such, in many cases, devices that comprise multiple finFET transistors of varying gate lengths, or channel lengths, are formed in close proximity. In many devices, where the channel width between the source and drain is reduced, the so-called short-channel effect may occur. This may cause variations in the threshold voltage ($V_T$) between one device to another.

As the length of the gate channel is reduced, the $V_T$ may also change. Thus, in a device that contains transistors of varying gate channel lengths, different threshold voltages may be applicable to different transistors. That is, there may be appreciable differences in threshold voltages between long-channel devices compared to threshold voltages of shorter-channel devices. This may cause performance problems, for example, for a given voltage, some of the transistors may become activated, while others stay off, required compensation circuits that may be costly in terms of power consumption and space consumption.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for controlling threshold voltage values for a plurality of transistor devices. Determine a first threshold voltage of a first transistor gate comprising a first gate channel having a first length. Determine a second length of a second gate channel of a second transistor gate. Determining a process adjustment of the second gate based on the second length for providing a second threshold voltage of the second transistor gate. The second threshold voltage is within a predetermined range of the first threshold voltage. Provide data relating to process adjustment to a process controller for performing the process adjustment.

BRIEF DESCRIPTION OF THE DRAWINGS

The disclosure may be understood by reference to the following description taken in conjunction with the accompanying drawings, in which like reference numerals identify like elements, and in which.

Figure 1:
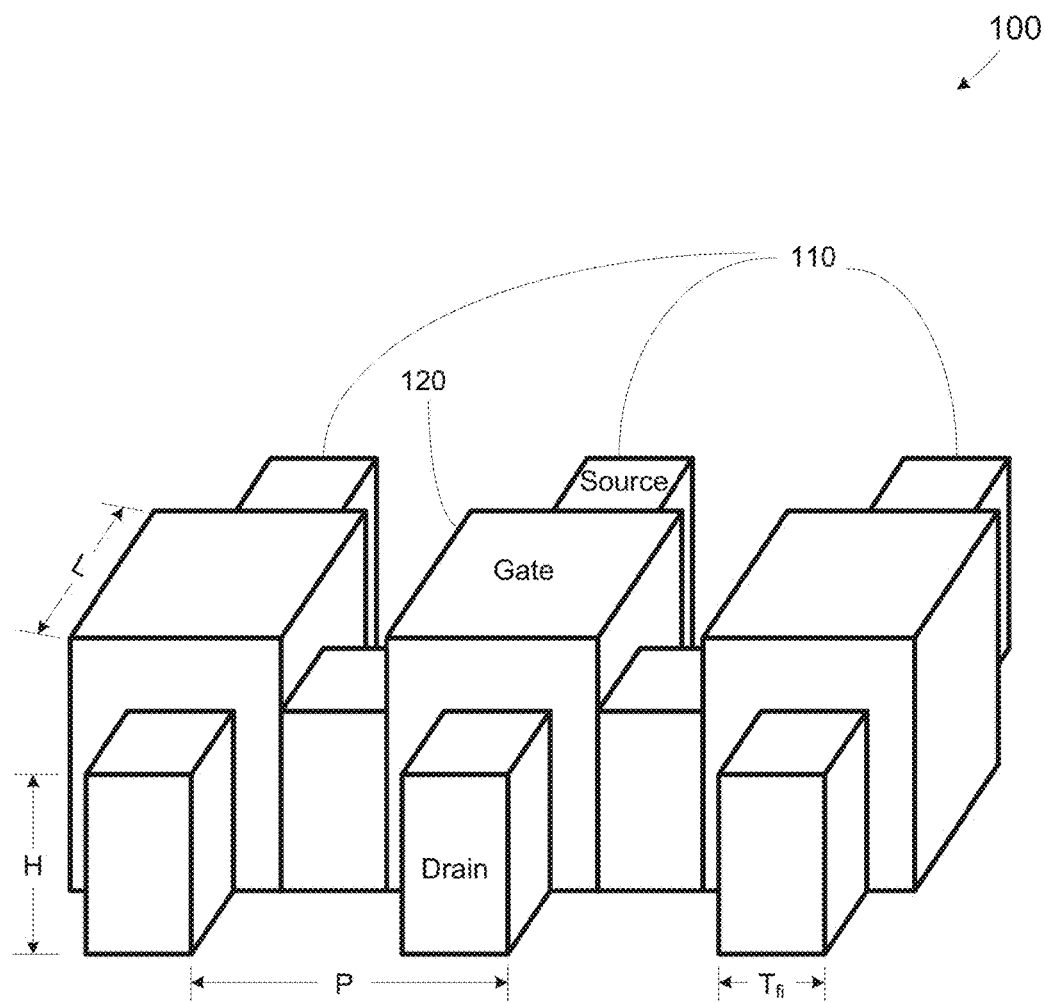
FIG. 1 illustrates a stylized depiction of a state-of-the-art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Further, the drawings provided are not drawn to scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming devices that comprise finFETs of varying gate channel lengths, and providing respective threshold voltages that are within a predetermined variance. For example, embodiments herein provide for forming a device comprising a plurality of finFET devices having different gate channels, wherein the finFET devices comprising varying corresponding work function characteristics. The various work function characteristics may compensate for the different gate channels lengths such that the threshold voltages for the various finFET devices are within a predetermined range. Therefore, embodiments herein provide for finFET devices of different gate channel lengths having similar threshold voltages.

In some embodiments, in order to provide substantially uniform threshold voltages, the work function characteristic that is modulated is the thickness of the work function material during formation of the gate portion of the device. In other embodiments, in order to provide substantially uniform threshold voltages, the work function characteristic that is modulated is the type of material used as a work function layer. In yet other embodiments, in order to provide substantially uniform threshold voltages, a halo layer formed adjacent the source and drain regions may be modulated, or eliminated. The term "substantially uniform threshold voltages" may refer to threshold voltages that are within a predetermined range of voltage values. The embodiments described herein may address the problems associated with threshold voltage differences in devices having different gate lengths. Further, other factors that may cause threshold voltage differences, such as gate design difference of gate line and space pitch, may also be addressed by adjusting threshold voltages using embodiments provided herein.

Figure 2:
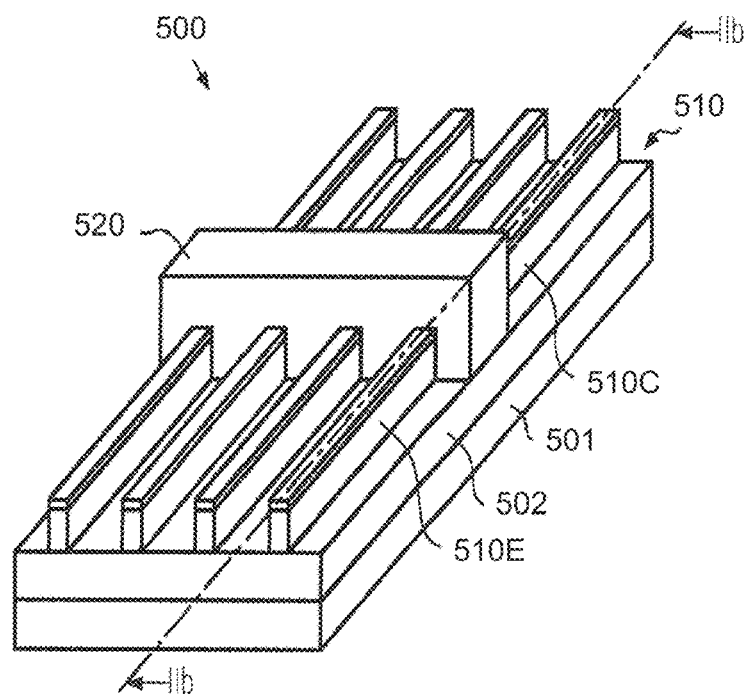
FIG. 2 illustrates a stylized depiction of a perspective view of a semiconductor device, in accordance to embodiments herein.
Figure 3:
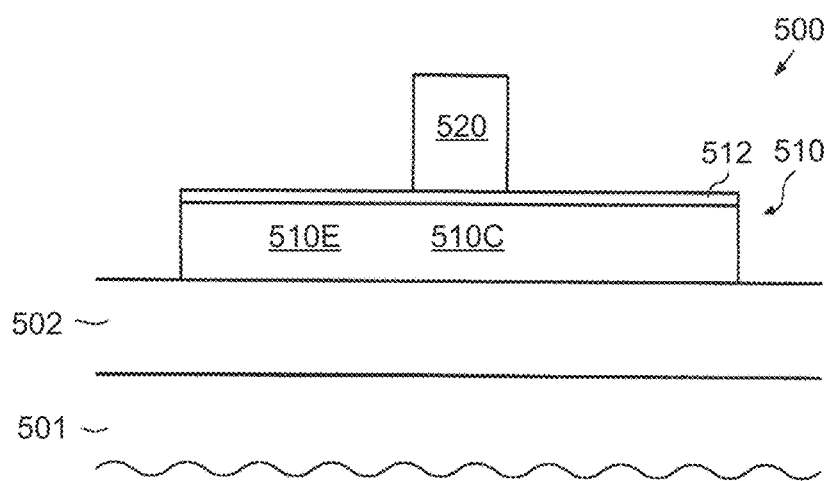
FIG. 3 illustrates a stylized depiction of a cross-sectional view taken along a first section of the device of FIG. 2, in accordance to embodiments herein.
Figure 4:
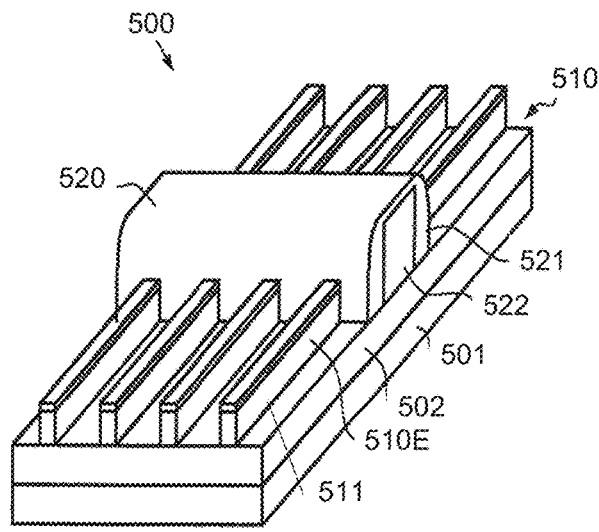
FIG. 4 illustrates a stylized depiction of a cross-sectional view of the device of FIG. 2, further along the process, in accordance to embodiments herein.

FIGS. 2-4 illustrate various stylized diagrams relating to performing an initial process of forming a finFET device, in accordance with embodiments herein. FIG. 2 schematically illustrates a perspective view of a semiconductor device 500, which may be a finFET device comprising a plurality of fins. In the manufacturing stage shown, the device 500 may comprise a substrate 501, such as a silicon substrate or any other appropriate carrier material, on which may be formed an appropriate base layer 502, which, in some illustrative embodiments, may represent an insulating layer, such as a silicon dioxide layer, a silicon nitride layer, a silicon oxynitride layer and the like. For example, if the substrate 501 may be comprised of a substantially crystalline semiconductor material, the base layer 502, if provided in the form of an insulating material, and the substrate 501 may define a silicon on insulator (SOI) configuration.

Moreover, a plurality of fins 510 are formed on the layer 502 and comprise respective end portions 510E and a central portion 510C, which is covered by a gate electrode structure 520. Furthermore, a gate insulation material may be formed at least on sidewalls of the fins 510 (not shown in FIG. 2), while a corresponding gate insulation layer may be formed on a top surface of the fins 510 if a tri-gate transistor architecture is considered. In other cases, the fins 510 may be covered by a cap layer (not shown) which may result in an insufficient capacitive coupling to the fins 510, so that the top surface thereof may effectively not act as a channel region. With respect to any material composition of the fins 510, it is to be appreciated that any appropriate material, such as silicon, silicon/germanium, germanium or any other appropriate semiconductor compound may be used, depending on the overall device requirements. Similarly, the corresponding dimensions of the fins 510 may be selected in accordance with the design rules of the corresponding technology node under consideration.

FIG. 3 illustrates a stylized depiction of a cross-sectional view taken along the section IIb of FIG. 2. As illustrated, a cap layer 512, such as a silicon oxide layer or a high-K HFO2 layer, and/or the like, may be formed on the fins 510, and the gate electrode structure 520. The gate electrode structure 520 may be comprised of any appropriate material, such as polysilicon, a metal-containing material and the like, may be formed on the cap layer 512 and may also extend down to the layer 502 along the corresponding sidewalls of a Fin 510 (not shown in the section of FIG. 3). The semiconductor device 500 as shown in FIGS. 2 and 3 may be formed on the basis of well-established process techniques as are, for instance, also explained above with reference to the device 500.

FIG. 4 illustrates a stylized depiction of a perspective view of the transistor 500 in a further advanced manufacturing stage. As illustrated, the gate electrode structure 520 may comprise a sidewall spacer structure 521, which may be comprised of any appropriate material such as silicon nitride, silicon dioxide and the like. The spacer structure may be formed on the basis of well-established deposition and etch techniques, wherein a width of the spacer structure 520 may be selected in accordance with a desired dopant profile in each of the end portions 510E of the Fins 510. That is, moderately high dopant concentration may be established in the end portions 510E adjacent to the gate electrode structure 520, possibly by using an offset spacer element (not shown) and thereafter one or more spacer elements of the structure 521 may be provided and may be used as an implantation mask during one or more subsequent implantation steps to provide the desired high dopant concentration in the end portions 510E with a lateral distance to a gate electrode material 522 of the gate electrode structure 520. It should be appreciated that any appropriate concentration profile extending from the electrode material 522 may be established by appropriately forming a corresponding number of spacer elements in the structure 521. It should further be appreciated that any other implantation processes may be performed, for instance with respect to defining a counter doped area in the vicinity of the central portion 510C, which represents the actual channel region. Drain and source regions 511 may be formed at oppositely positioned end portions 510E having the desired dopant concentration and concentration gradient with respect to the central portion 510C. Based on the concepts illustrated with regard to FIGS. 2-4, various finFET devices that have various gate channel lengths may be formed. Employing one or more of the concepts exemplified by the embodiments provided herein, the various finFET devices that have various gate channel lengths may display substantially similar threshold voltage values.

Figure 5:
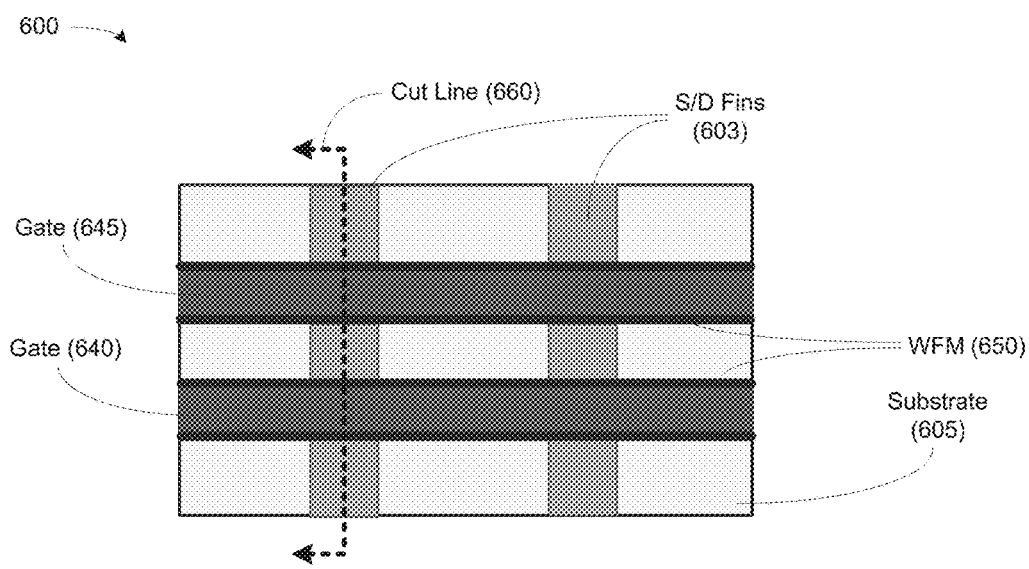
FIG. 5 illustrates a stylized, simplified top view of an a finFET device, in accordance with embodiments herein.

Turning now to FIG. 5, a stylized, simplified top view of a finFET device, in accordance with embodiments herein, is illustrated. FIG. 5 illustrates a device 600 comprising a plurality of source/drain fins 603 formed on a substrate 605, similar to the example shown in FIG. 4. Further, FIG. 5 illustrates a plurality of gates, e.g., a gate 640 and a gate 645. The gates 640, 645 may be surrounded by a layer of work function material 650. FIG. 5 also shows a cut line 660, wherein FIGS. 6-12 represent stylized cross-sectional views of finFET devices with respect to the cut line 660.

In some embodiments, threshold voltage of transistor devices may be divided into six categories: PFET Regular Voltage Threshold (PRVT); PFET low Voltage Threshold (PLVT); PFET Super-low Voltage Threshold (PSLVT); NFET Regular Voltage Threshold (NRVT); NFET low Voltage Threshold (NLVT); NFET Super-low Voltage Threshold (NSLVT). In some embodiments, the absolute value of the PRVT and NRVT may about 0.25 Volts, the absolute value of the PLVT and NLVT may about 0.20 Volts, and the absolute value of the PSLVT and NSLVT may about 0.15 Volts, wherein other voltage levels may be applied while remaining within the spirit of the present disclosure. Those skilled in the art having benefit of the present disclosure would readily understand that the voltage thresholds listed above are provided in terms of absolute values, and that that PFET device generally would have negative $V_T$ values and NFET devices would generally have positive $V_T$ values. Embodiments herein provide for maintaining substantially consistent threshold voltages for the different threshold voltage categories across a plurality of gate channel widths.

Figure 6:
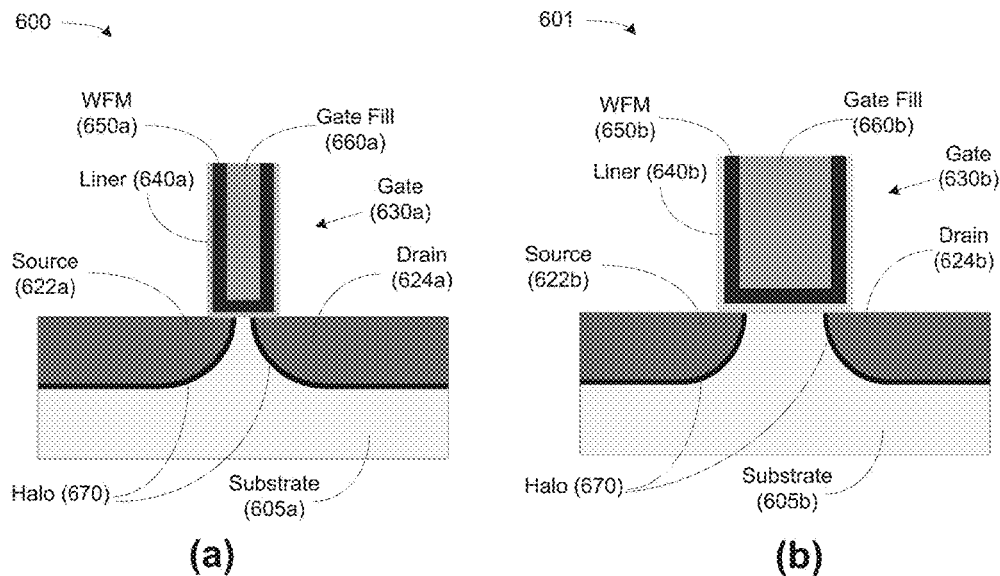
FIG. 6 illustrates stylized cross-sectional views of two finFETs having a PRVT characteristic and conventional work function metal layers.

Turning now to FIG. 6, stylized cross-sectional views of two finFETs having a PRVT characteristic and a conventional work function metal layers, are illustrated. FIG. 6 comprises a $1^{st}$ device 600 shown in part (a) of FIG. 6, and a $2^{nd}$ device 601 shown in part (b) of FIG. 6. The device 600 comprises a substrate 605a, gate 630a, a source region 622a, and a drain region 624a. Generally, the source/drain regions 622*a*, 622*b*, 624*a*, 624*b* are surrounded by a so-called halo layer 670, as shown in FIG. 6.

The device 601 comprises a substrate 605*b*, gate 630*b*, a source region 622*b*, and a drain region 624*b*. Each device 600, 601 comprises a metal within a gate electrode, generally referred to as a work-function metal (WFM). The gate 630*a* comprises a high-k liner 645*a*, a WFM feature 650*a*, and a gate fill region 660*a*, which may be filled with tungsten. Similarly, the gate 630*b* comprises a high-k liner 645*b*, a WFM feature 650*b*, and a gate fill region 660*b*.

As depicted in FIG. 6, the channel length of the gate 630*a* is relatively smaller than that of the gate 630*b*. As such, the gate fill region 660*b* is wider than the gate fill region 660*a*. In conventional devices, such as the devices 600, 601 depicted in FIG. 6, the WMF features 650*a*, 650*b* are similar in thickness and material-type. This conventional configuration may cause the threshold voltage of the device 600 to be appreciably different from the threshold voltage of the device 601.

Figure 7:
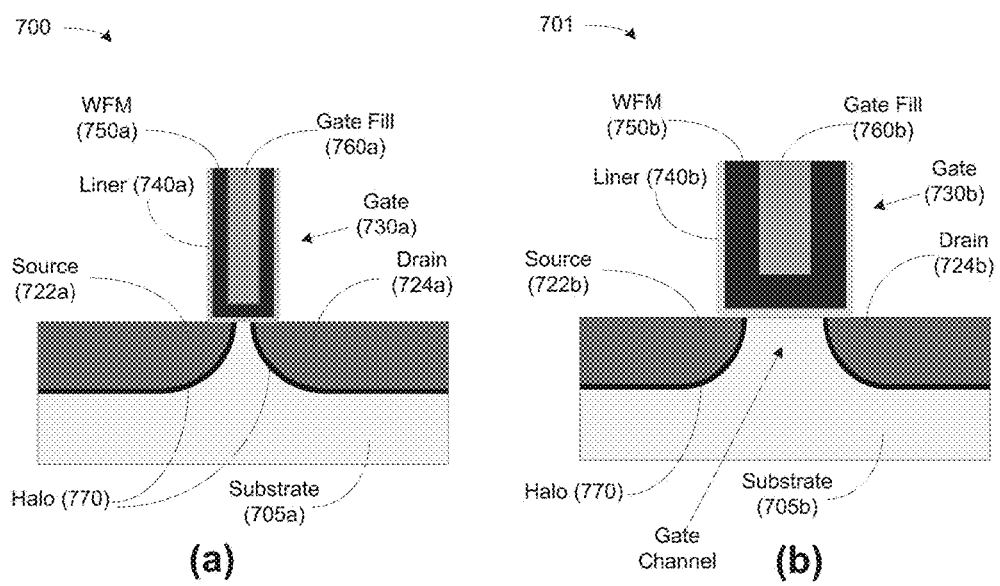
FIG. 7 illustrates stylized cross-sectional views of two finFETs having a PRVT characteristic and work function metal layers in accordance with an embodiment herein.

Turning now to FIG. 7, stylized cross-sectional views of two finFETs having a PRVT characteristic and a work function metal layers in accordance with an embodiment herein, are illustrated. FIG. 7 comprises a 1$^{st}$ device 700 shown in part (a) of FIG. 7, and a 2$^{nd}$ device 701 shown in part (b) of FIG. 7. The device 700 comprises a substrate 705*a*, gate 730*a*, a source region 722*a*, and a drain region 724*a*. Similarly, the device 701 comprises a substrate 705*b*, gate 730*b*, a source region 722*b*, and a drain region 724*b*. In some embodiments, the source and drain regions illustrated in FIGS. 6-12 may correspond to the fins 603 of FIG. 5.

In one embodiment, the source/drain regions 722*a*, 722*b*, 724*a*, 724*b* may be surrounded by a so-called halo layer 770, similar to the halo layer 670 of FIG. 6. In other embodiments, the deposition of the halo layer 770 may be omitted, wherein the source/drain regions 722*a*, 722*b*, 724*a*, 724*b* would not be surrounded by a halo layer.

The gate 730*a* comprises a high-k liner 745*a*, a work-function metal (WFM) feature 750*a*, and a gate fill region 760*a*, which in one embodiment, may be filled with tungsten. Similarly the gate 730*b* comprises a high-k liner 745*b*, a WFM feature 750*b*, and a gate fill region 760*b*.

As depicted in FIG. 7, the channel length of the gate 730*a* is relatively smaller than that of gate 730*b*. As such, the gate fill region 760*b* is wider than the gate fill region 760*a*. In one embodiment, WFM 750*a* has a different thickness as compared to WFM 750*b*. For example, the thickness of WFM 750*b* may be increased relative to that of WFM 750*a* by a predetermined amount to account for the increase in the gate channel of the device 701. In one embodiment, the increase in the thickness of WFM 750*b* (from a baseline thickness of WFM 750*a*) may be proportional to the increase in the length of the gate channel of the device 701, with respect to the length of the gate channel of the device 700. In some embodiments, the thickness of WFM 750*b* may be increased such that the gate fill region 760*b* is substantially the same as the gate fill region 760*a*. In this manner, the change in threshold voltage of the device 701 due to the increased size of its gate channel may be decreased or substantially minimized to make the threshold voltage of the short channel device 700 and the long channel device 701 substantially similar.

Figure 8:
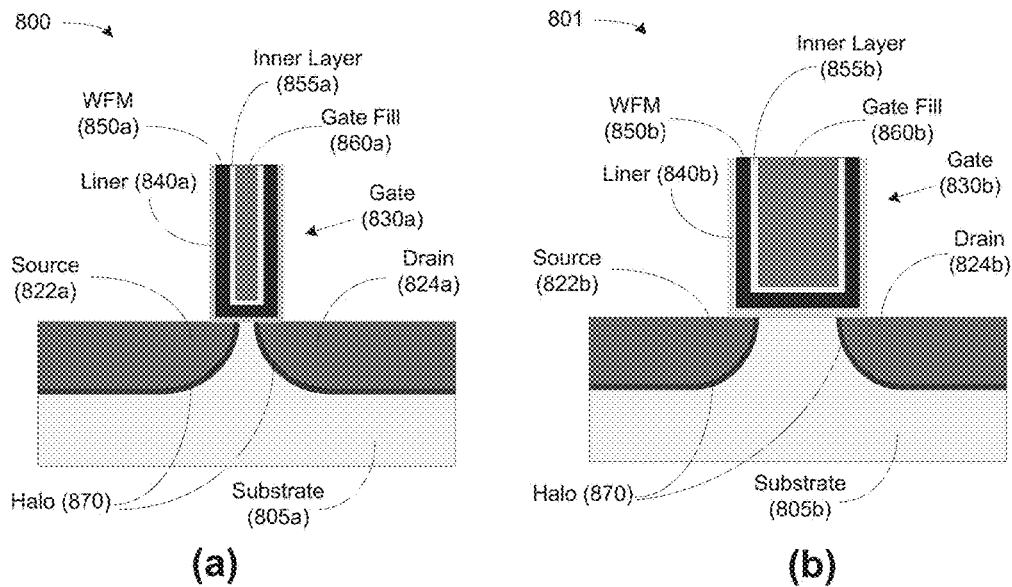
FIG. 8 illustrates stylized cross-sectional views of two finFETs having an NRVT characteristic and conventional work function metal layers.

Turning now to FIG. 8, stylized cross-sectional views of two finFETs having an NRVT characteristic and conventional work function metal layers are illustrated. FIG. 8 comprises a 1st device 800 shown in part (a) of FIG. 8, and a 2nd device 801 shown in part (b) of FIG. 8. The device 800 comprises a substrate 805*a*, gate 830*a*, a source region 822*a*, and a drain region 824*a*. The device 801 comprises a substrate 805*b*, gate 830*b*, a source region 822*b*, and a drain region 824*b*. Generally, the source/drain regions 822*a*, 822*b*, 824*a*, 824*b* are surrounded by a halo layer 870, as shown in FIG. 8.

The device 801 comprises a gate 830*b*, a source region 822*b*, and a drain region 824*b*. Each device 800, 801 comprises a metal within a gate electrode, known as a work-function metal (WFM). The gate 830*a* of the device 800 comprises a high-k liner 845*a*, a WFM feature 650*a*, an inner layer 855*a*, such as a titanium combination layer, e.g., TiAl or TiAlC, and a gate fill region 860*a*, which may be filled with tungsten. Similarly the gate 830*b* of the device 801 comprises a high-k liner 845*b*, an inner layer 855*b*, a WFM feature 850*b*, and a gate fill region 860*b*.

As depicted in FIG. 8, the channel length of the gate 830*a* is relatively smaller than that of gate 830*b*. As such, the gate fill region 860*a* is wider than the gate fill region 860*b*. In conventional devices, such as the devices 800, 801 depicted in FIG. 8, the WMF features 850*a*, 850*b* are similar in thickness and material-type. This conventional configuration may cause the threshold voltage of the device 800 to be appreciably different from the threshold voltage of the device 801.

Figure 9:
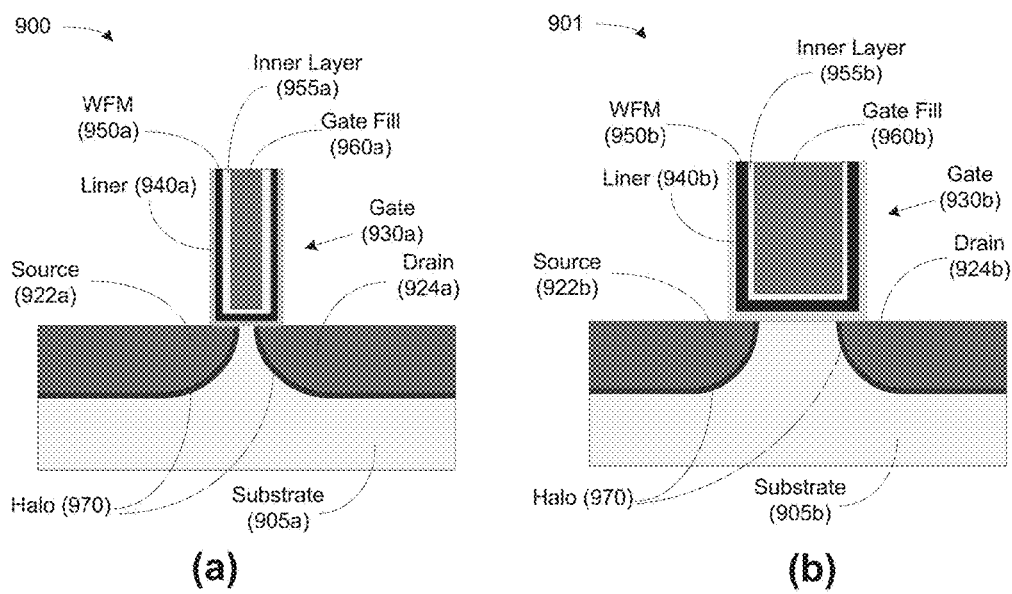
FIG. 9 illustrates stylized cross-sectional views of finFETs having an NRVT characteristic and work function metal layers in accordance with one embodiment.
Figure 10:
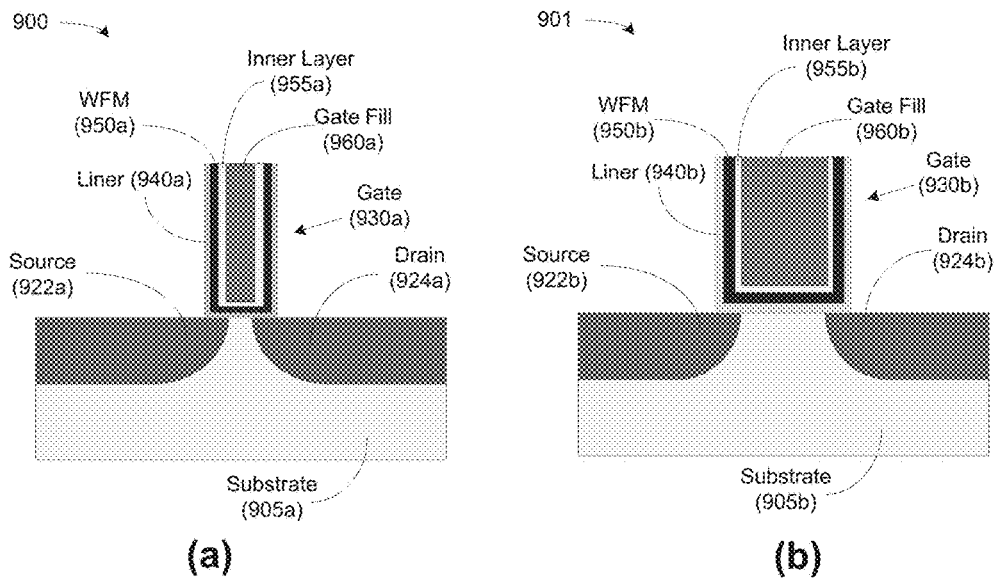
FIG. 10 illustrates stylized cross-sectional views of finFETs having an NRVT characteristic and work function metal layers in accordance with a another embodiment.

Turning now to FIGS. 9 and 10, stylized cross-sectional views of finFETs having an NRVT characteristic and work function metal layers in accordance with embodiments herein, are illustrated. FIGS. 9 and 10 each comprise a 1st device 900 shown in part (a) of FIG. 9, and a 2nd device 901 shown in part (b) of 10. The device 900 comprises a substrate 905*a*, gate 930*a*, a source region 922*a*, and a drain region 924*a*. The device 901 comprises a substrate 905*b*, gate 930*b*, a source region 922*b*, and a drain region 924*b*. In one embodiment, the source/drain regions 922*a*, 922*b*, 924*a*, 924*b* of FIG. 9 may be surrounded by a halo layer 970, similar to the halo layer 670 of FIG. 6. In other embodiments, as exemplified in FIG. 10, the deposition of the halo layer 970 may be omitted, wherein the source/drain regions 922*a*, 922*b*, 924*a*, 924*b* in FIG. 10 would not be surrounded by a halo layer. In some embodiments, the halo layers of FIG. 9 may only be formed on one device 900 or the other 901 for achieving threshold voltage levels that are within predetermined ranges.

The gate 930*b* comprises a high-k liner 945*b*, a work-function metal (WFM) feature 950*b*, and an inner layer 955*b*, such as a titanium combination layer, e.g., TiAl or TiAlC. Further, within the WFM 950*a* (see portion (a)) and the layer 955*a*, a gate fill region 960*a* is formed, which in one embodiment, may be filled with tungsten. Similarly the gate 930*b* comprises a high-k liner 945*b*, a WFM feature 950*b*, a titanium combination layer 955*b*, and a gate fill region 960*b*.

As depicted in FIG. 9, the channel length of the gate 930*a* is relatively smaller than that of gate 930*b*. As such, the gate fill region 960*b* is wider than the gate fill region 960*a*. In one embodiment, WFM 950*a* has a different thickness as compared to WFM 950*b*. For example, the thickness of WFM 950*b* may be increased by a predetermined amount to account for the increase in the gate channel of the device 901. In one embodiment, the increase in the thickness of WFM 950*b* (from a baseline thickness of WFM 950*a*) may be proportional to the increase in the length of the gate channel of the device 901, with respect to the length of the gate channel of the devices 900, 901.

In some embodiments, the thickness of WFM 950*b* may be increased such that the proportion of the WFM 950*b* to the gate fill region 960*b* its different from the proportion of the WFM 950*b* to the gate fill region 960*b*. Therefore, in one embodiment, for a small gate channel length in an NRVT device, a relatively thin WFM may be used, wherein a thicker WFM may be used for a larger gate channel length to preserve similar $V_T$ between those two devices.

In this manner, compensation to the change in gate channel lengths may be made such that the change in threshold voltage of the device 901 compared to the $V_T$ of device 900 due to the increased size of its gate channel may be decreased or substantially minimized. Further, in some embodiments, for NSLVT devices, similar WFM thickness adjustments of FIGS. 9 and 10 may be made to provide substantially similar $V_T$ values.

Figure 11:
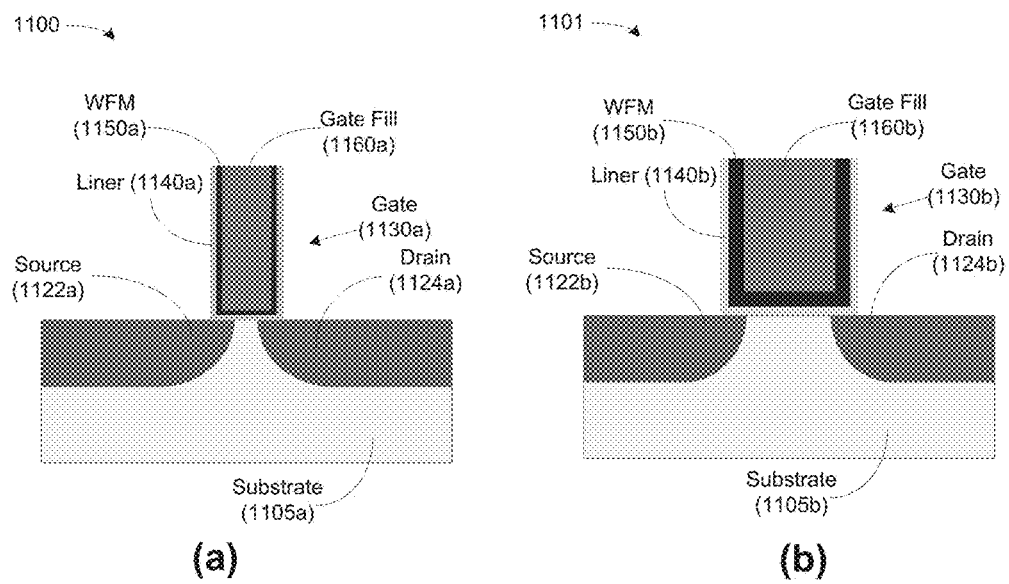
FIG. 11 illustrates stylized cross-sectional views of finFETs having an PRVT characteristic and opposite-polarity work function metal layers, in accordance with one embodiment.
Figure 12:
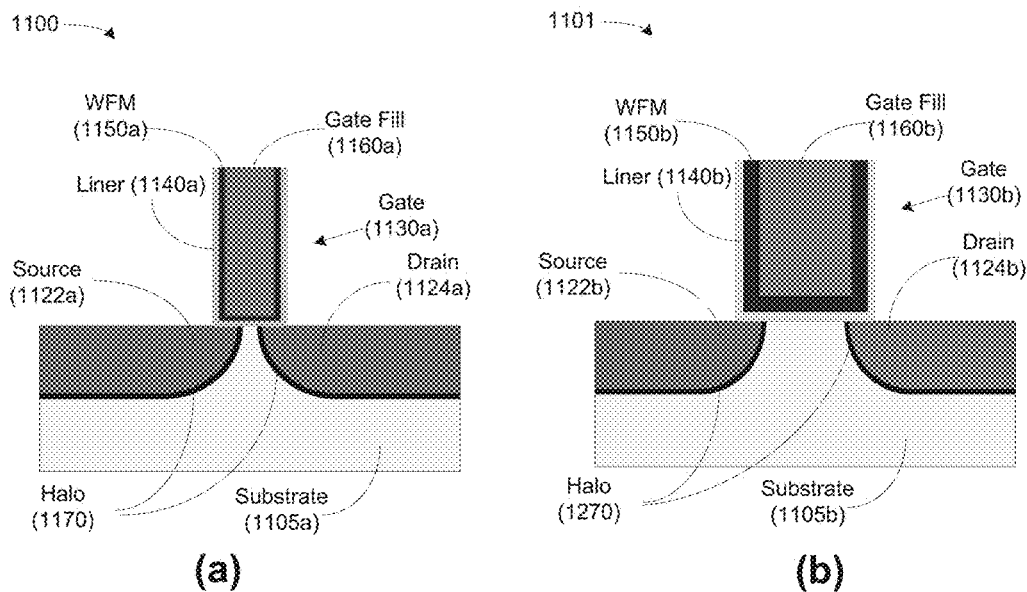
FIG. 12 illustrates a stylized cross-sectional views of finFETs having an PRVT characteristic and opposite-polarity work function metal layers, in accordance with another embodiment.

Turning now to FIGS. 11 and 12, stylized cross-sectional views of finFETs having a PRVT characteristic and opposite-polarity work function metal layers in accordance with embodiments herein, are illustrated. In general, two types of work force metals (WFMs) may be used in processing of finFET devices: a first WFM for p-channel devices and a second WFM for n-channel devices. Generally, for affecting voltage thresholds, a large effective work function (i.e., the first WFM), which may indicate a large barrier height to an NFET device, is applied to PFET devices. In contrast, generally, for affecting voltage thresholds, a small effective work function (i.e., the second WFM), which may indicate a large barrier height to a PFET device, is applied to NFET devices. The term "polarity" with regard to WFM generally refers to the type of effective WFM used for PFET devices versus the type of effective WFM used for NFET devices, since PFET and NFET are generally considered to be of opposite polarities. Therefore, in some embodiments, the term "opposite polarity WFM" may refer to using the second WFM on a PFET device and the first WFM on an NFET device. The effective WFM, and hence the WFM polarity, may be affected by one or more processes, such as doping process, alloying process, annealing process, ion implantation process, etc.

FIGS. 11 and 12 each comprise a 1st device 1100 shown in part (a) of FIGS. 11 and 12, and a 2nd device 1101 shown in part (b) of FIGS. 11 and 12. The device 1100 comprises a substrate 1105*a*, gate 1130*a*, a source region 1122*a*, and a drain region 1124*a*. Similarly, the device 1101 comprises a substrate 1105*b*, gate 1130*b*, a source region 1122*b*, and a drain region 1124*b*. In one embodiment, the source/drain regions 1122*a*, 1122*b*, 1124*a*, 1124*b* of FIG. 12 may be surrounded by a halo layer 1270, similar to the halo layer 670 of FIG. 6. In other embodiments, as exemplified in FIG. 11, the deposition of the halo layer 1270 may be omitted, wherein the source/drain regions 1122*a*, 1122*b*, 1124*a*, 1124*b* would not be surrounded by a halo layer.

The gate 1130*b* comprises a high-k liner 1145*b*, a work-function metal (WFM) feature 1250*b*. Further, within the WFM 1150*a* (see portion (a)) and the layer 1155*a*, a gate fill region 1160*a* is formed, which in one embodiment, may be filled with tungsten. Similarly the gate 1130*b* comprises a high-k liner 1145*b*, a WFM feature 1150*b*, a titanium combination layer 1155*b*, and a gate fill region 1160*b*.

As depicted in FIG. 11, the channel length of the gate 1130*a* is relatively smaller than that of gate 1130*b*. As such, the gate fill region 1160*b* is wider than the gate fill region 1160*a*. In one embodiment, WFM 1150*a* has a different thickness as compared to WFM 1150*b*. For example, the thickness of WFM 1150*b* may be increased by a predetermined amount to account for the difference in the gate channel of the device 1101. In one embodiment, the increase in the thickness of WFM 1150*b* (from a baseline thickness of WFM 1150*a*) may be proportional to the increase in the length of the gate channel of the device 1101, with respect to the length of the gate channel of the devices 1100, 1101. Therefore, the WFM 1150*a* of the device 1100 may be thinner layer relative to the thin WFM layer 1150*b*. Further, the WFM 1150*a* may have a different polarity as compared to the WFM 1150*b*. In one embodiment, the difference in polarity in one of the devices 1100, 1101, in combination with the change in the thicknesses of the WFM layer 1150*a*, 1150*b*, may modify the $V_T$ such that the threshold voltages of the devices 1100, 1101 may be within a predetermined variation range.

In some embodiments, the predetermined variations in $V_T$ may be about 10%; therefore, for a $V_T$ of about 0.250 Volts, the predetermined acceptable differential may be about 0.025 Volts.

In some embodiments, the thickness of WFM 1150*b* may be increased from a "thinner" level to a "thin" level such that the proportion of the WFM 1150*b* to the gate fill region 1160*b* is different from the proportion the WFM 1150*b* to the gate fill region 1160*b*. In some embodiments, a "thin" level WFM may be about 30-40 A (e.g., TiN), the "thinner" level may be below 30 A, and a "thick" level may be about 40-50 A. Therefore, in one embodiment, for a small gate channel length in a PRVT device, a relatively thinner WFM may be used, wherein a thin WFM may be used for a larger gate channel length to preserve similar $V_T$ between those two devices. In this manner, compensation to the change in gate channel lengths may be made such that the change in threshold voltage of the device 1101 compared to the $V_T$ of device 1100 due to the increased size of its gate channel may be decreased or substantially minimized.

In some embodiments, similar to controlling the threshold voltages of PFET devices having different channel lengths by using WFM layers of varying polarities, the threshold voltages of NFET having different channel lengths may be brought within predetermined tolerance levels by using WFM layers of varying polarities.

Figure 13:
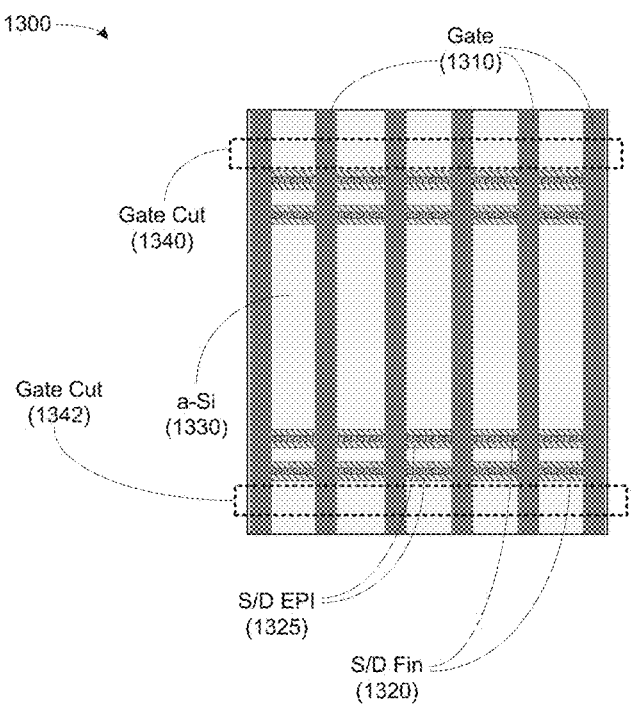
FIG. 13 illustrates a stylized depiction of a top view of a gate cut region on a semiconductor device, in accordance with embodiments herein.

Turing now to FIG. 13, a stylized depiction of a top view of a gate cut region on a semiconductor device, in accordance with embodiments herein is illustrated. An integrated circuit 1300 is formed, wherein a plurality of gate formations 1310 may be formed on a substrate layer (e.g., amorphous silicon) 1330. Gate spacers may be formed around the gate formations 1310. Further, a plurality of source/drain (S/D) formations 1320 are formed. Epitaxial (EPI) formations 325 (N-type and P-type) are formed on the S/D fins 320.

FIG. 13 also shows two exemplary gate cut regions 1340, 1342. In some embodiments, the positioning of the gate cut regions 1340, 1342 may affect the threshold voltage of the device of the circuit 1300. The gates 1310 may be cut at the location of the gate cuts 1340, 1342. The determination of position for the gate cutting may be performed prior to forming the gates as to affect the threshold voltages of the device to be processed (e.g., during the design process). Positioning the gate cuts 1340, 1342 and source/drain design may affect the device design, thereby affecting threshold voltage of the finFETs used to form the circuit 1300. The positioning of the gate cuts 1340, 1342 may affect the leakage current, which in turn, may affect the threshold voltage of the device. In some embodiments, the adjustments to WFM layers and/or the halo features described above may be made to achieve desired threshold voltage ranges between devices of varying gate-source-drain designs.

Therefore, in order for compensating for the change in threshold voltages due to varying gate channel lengths, and changes caused by the location of the gate cut locations may be made to bring the threshold voltages of finFET devices that have varying gate channel lengths or varying gate-source-drain designs.

Figure 14:
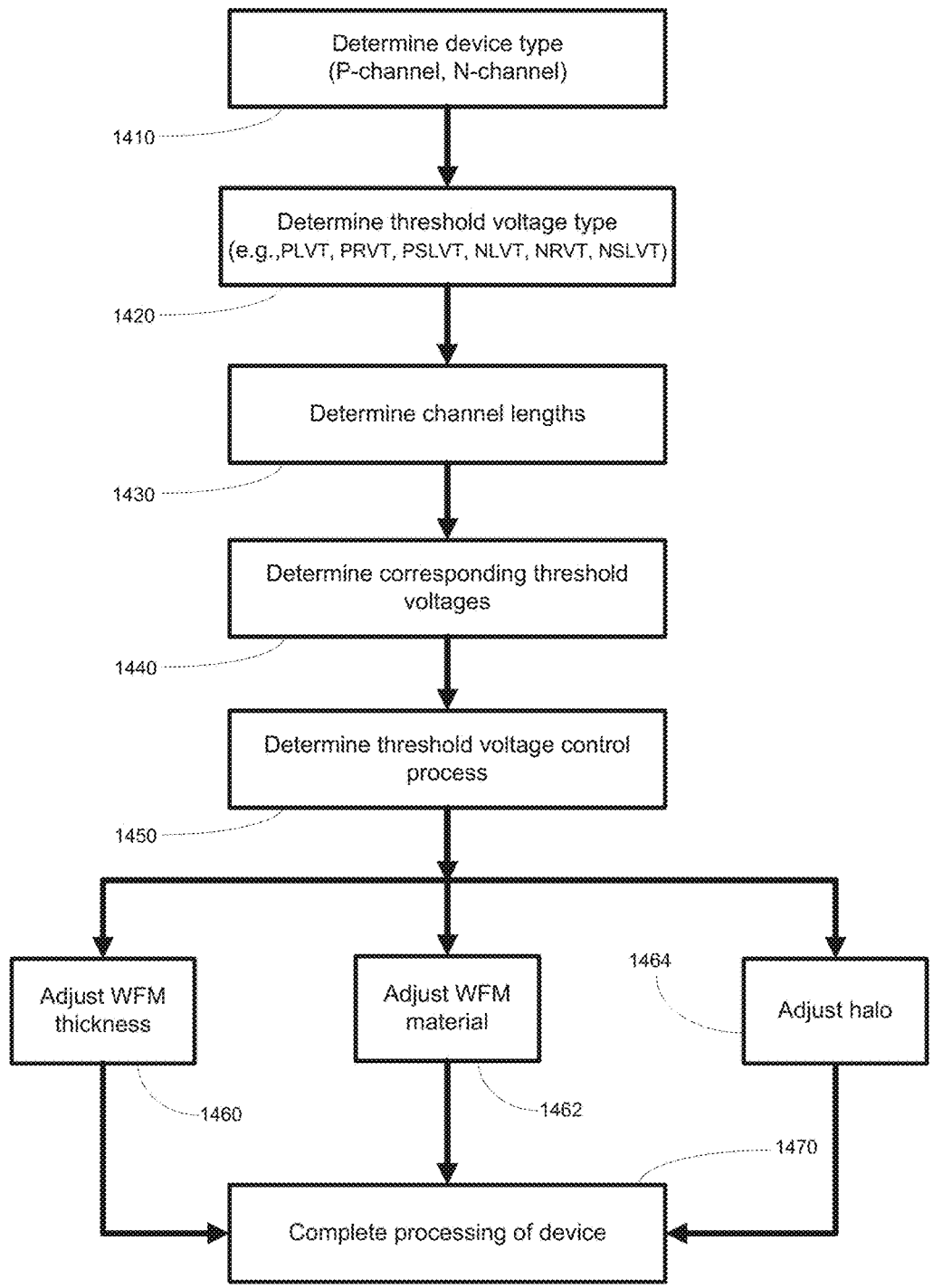
FIG. 14 illustrates a flowchart depiction of the process for adjusting threshold voltages across devices having varying gate channel lengths, in accordance with embodiments herein.

Turning now to FIG. 14, a flowchart depiction of the process for adjusting threshold voltages across devices having varying gate channel lengths, in accordance with embodiments herein, is illustrated. The process described herein may be performed during the design stage and/or during the processing stage.

A determination may be made as to the device type of a finFET device, i.e., P-type device or N-type device (at 1410). Further, a determination may be made as to the threshold voltage of the device, i.e., PLVT, PRVT, PSLVT, NLVT, NRVT, NSLVT (at 1420). Further, the gate channel lengths of the devices used to form a standard cell and/or an integrated circuit may be determined (at 1430). Further, the threshold voltages corresponding to the various gate channel lengths may be determined (at 1440).

Upon determining the varying threshold voltages, a threshold voltage control process may be determined (at 1450). This process may include determining a range of threshold voltage values within which the threshold voltage of device with varying gate channel thresholds should be contained. Further, this process may also include identifying the particular process-action to be taken to particular devices. For example, a particular device with a larger gate channel may be selected for modifying the WFM thickness, WFM material, and/or the presence of a halo layer. One or more of these techniques may be used to bring the $V_T$ levels of various devices having different gate and source/drain designs, within an acceptable, predetermined range.

Upon determining the threshold voltage adjustment parameters, a particular design and/or process adjustment may be performed. An adjustment of the WFM thickness may be performed (at 1460), an adjustment of the WFM material (e.g., material type, polarity, etc.) may be performed (at 1462), and/or an adjustment to the halo layer process may be performed (at 1464). Based upon these adjustments, the processing of the integrated circuit that comprises the devices of varying gate channel lengths are performed (at 1470). In this manner, an integrated circuit having devices of varying gate channel lengths are formed such that they exhibit threshold voltages that are within a predetermined acceptable range.

Figure 15:
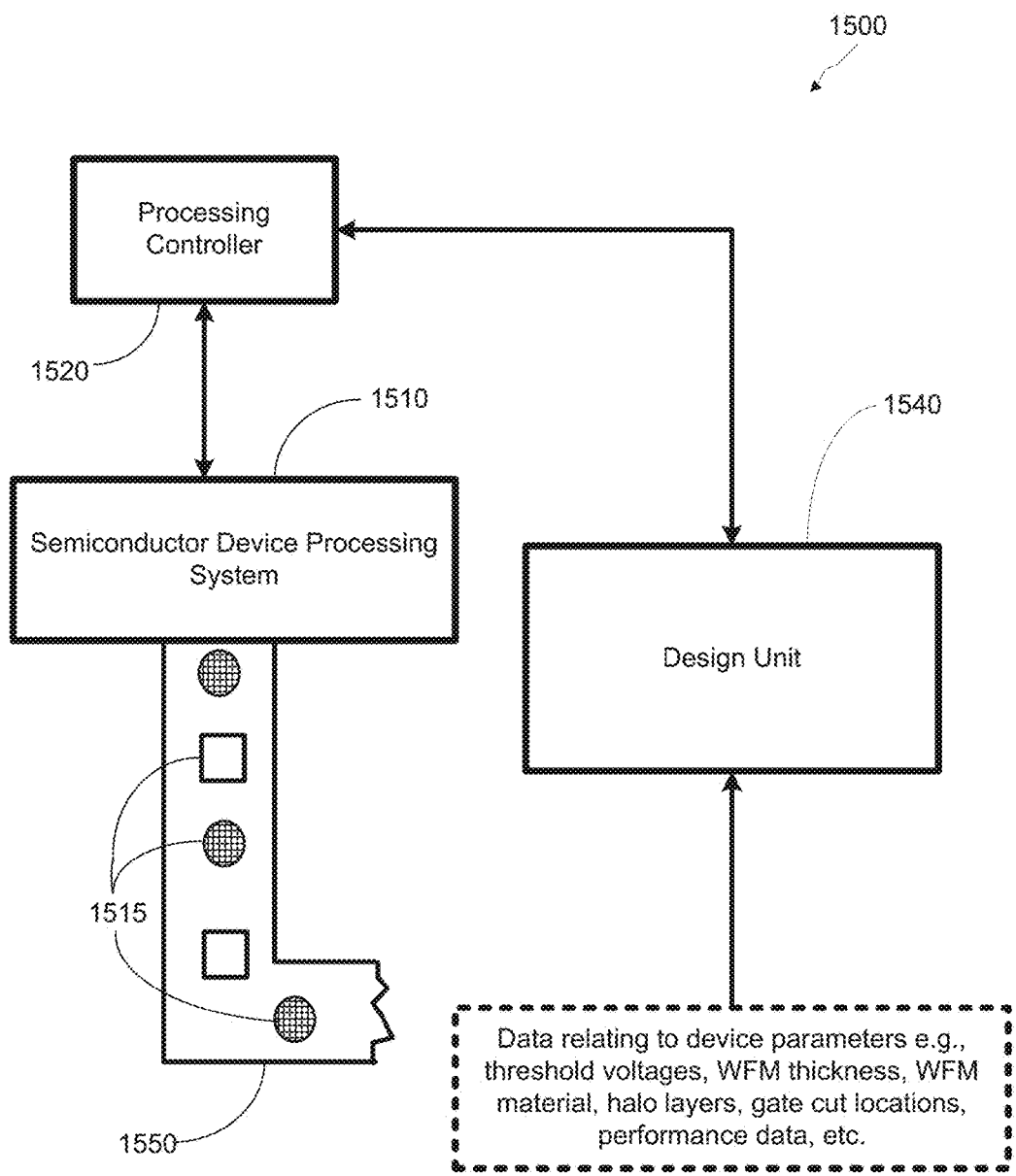
FIG. 15 illustrates a stylized depiction of a system for fabricating a semiconductor device having varying gate channel lengths finFET devices and threshold voltages within a predetermined range, in accordance with embodiments herein.

Turning now to FIG. 15, a stylized depiction of a system for fabricating a semiconductor device package comprising an integrated circuit having devices of varying gate channel lengths are formed such that they exhibit threshold voltages that are within a predetermined acceptable range, in accordance with embodiments herein, is illustrated. The system 1500 of FIG. 15 may comprise a semiconductor device processing system 1510 and a design unit 1540. The semiconductor device processing system 1510 may manufacture integrated circuit devices based upon one or more designs provided by the design unit 1540.

The semiconductor device processing system 1510 may comprise various processing stations, such as etch process stations, photolithography process stations, CMP process stations, etc. One or more of the processing steps performed by the processing system 1510 may be controlled by the processing controller 1520. The processing controller 1520 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1510 may produce integrated circuits on a medium, such as silicon wafers. More particularly, the semiconductor device processing system 1510 produce integrated circuits having finFET devices that comprise fins that have channel voids filled with oxide and performed in a manner to reduce or substantially prevent oxidization, as described above.

The production of integrated circuits by the device processing system 1510 may be based upon the circuit designs provided by the integrated circuits design unit 1540. The processing system 1510 may provide processed integrated circuits/devices 1515 on a transport mechanism 1550, such as a conveyor system. In some embodiments, the conveyor system may be sophisticated clean room transport systems that are capable of transporting semiconductor wafers. In one embodiment, the semiconductor device processing system 1510 may comprise a plurality of processing steps to provide adjustments of the WFM thickness, WFM material, halo layers, and of the gate cut locations, etc., as described above.

In some embodiments, the items labeled "1515" may represent individual wafers, and in other embodiments, the items 1515 may represent a group of semiconductor wafers, e.g., a "lot" of semiconductor wafers. The integrated circuit or device 1515 may be a transistor, a capacitor, a resistor, a memory cell, a processor, and/or the like.

The integrated circuit design unit 1540 of the system 1500 is capable of providing a circuit design that may be manufactured by the semiconductor processing system 1510. The integrated circuit design unit 1540 may be capable of determining the number of devices (e.g., processors, memory devices, etc.) to place in a device package. The integrated circuit design unit 1540 may also determine the height of the fins, the size of the fin channels, etc. These dimensions may be based upon data relating to drive currents/performance metrics, device dimensions, threshold voltages, etc. Based upon such details of the devices, the integrated circuit design unit 1540 may determine specifications of the finFETs that are to be manufactured. Based upon these specifications, the integrated circuit design unit 1540 may provide data for manufacturing a semiconductor device package described herein. This specification may include processing semiconductor wafer such that adjustments to the adjustments of the WFM thickness, WFM material, and/or halo layers may be made to provide threshold voltage values within a predetermined acceptable range.

The system 1500 may be capable of performing analysis and manufacturing of various products involving various technologies. For example, the system 1500 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   determining a first threshold voltage of a first transistor gate comprising a first gate channel having a first length;
   determining a second length of a second gate channel of a second transistor gate;
   determining a process adjustment of said second gate based on said second length for providing a second threshold voltage of said second transistor gate, wherein said second threshold voltage is within a predetermined range of said first threshold voltage, wherein determining said process adjustment comprises determining a thickness of a first work function metal (WFM) layer of said first transistor gate and determining a thickness of a second WFM of said second transistor gate, wherein said second WFM layer is thicker than the thickness of said first WFM layer, in response to a determination that said first threshold voltage is at least one of a PFET low voltage threshold (PLVT), a PFET regular voltage threshold (PRVT), a PFET super-low voltage threshold (PSLVT), an NFET low voltage threshold (NLVT), a NFET regular voltage threshold (NRVT), or a NFET super-low voltage threshold (NSLVT); and
   providing data relating to process adjustment to a process controller for performing said process adjustment.

2. The method of claim 1, wherein determining said first voltage threshold comprises determining whether said first transistor gate is one of a PFET low voltage threshold (PLVT), a PFET regular voltage threshold (PRVT), a PFET super-low voltage threshold (PSLVT), an NFET low voltage threshold (NLVT), a NFET regular voltage threshold (NRVT), or a NFET super-low voltage threshold (NSLVT).

3. The method of claim 2, wherein:
   said PLVT and said NLVT are an absolute value of about 0.20 Volts;
   said PRVT and said NRVT are an absolute value of about 0.25 Volts; and
   said PSLVT and said NSLVT are an absolute value of about 0.15 Volts.

4. The method of claim 1, wherein a first WFM of said first transistor gate is of an opposite polarity of a second WFM.

5. The method of claim 1, wherein determining said process adjustment comprises determining a first material for said first WFM and a second material for said second WFM.

6. The method of claim 1, wherein determining said process adjustment comprises adjusting a halo layer adjacent a source and drain region corresponding to said second transistor gate, wherein adjusting said halo layer comprises providing a thinner halo layer or eliminating said halo layer.

7. The method of claim 4, wherein determining a thickness of a second WFM comprises determining that the second WFM layer is to be in the range of about 40-50 Å.

8. A system, comprising:
   a semiconductor device processing system to manufacture a semiconductor device comprising at least one fin field effect transistor (finFET); and
   a processing controller operatively coupled to said semiconductor device processing system, said processing controller configured to control an operation of said semiconductor device processing system;
   wherein said semiconductor device processing system is adapted to:
      determine a first threshold voltage of a first transistor gate comprising a first gate channel having a first length;
      determine a second length of a second gate channel of a second transistor gate;
      determine a process adjustment of said second gate based on said second length for providing a second threshold voltage of said second transistor gate, wherein said second threshold voltage is within a predetermined range of said first threshold voltage, wherein determining said process adjustment comprises determining a thickness of a first work function metal (WFM) layer of said first transistor gate and determining a thickness of a second WFM of said second transistor gate, wherein said second WFM layer is thicker than the thickness of said first WFM layer, in response to a determination that said first threshold voltage is at least one of a PFET low voltage threshold (PLVT), a PFET regular voltage threshold (PRVT), a PFET super-low voltage threshold (PSLVT), an NFET low voltage threshold (NLVT), a NFET regular voltage threshold (NRVT), or a NFET super-low voltage threshold (NSLVT); and
      provide data relating to process adjustment to said processing controller for performing said process adjustment.

9. The system of claim 8, further comprising a design unit configured to generate a first design comprising a definition for a process mask, a definition for forming said first and second transistor gates, wherein data from said design unit is used by said processing controller to control an operation of said semiconductor device processing system.

10. The system of claim 8, wherein said semiconductor device processing system is further adapted to:
   adjust a halo layer adjacent a source and drain region corresponding to said second transistor gate, wherein adjusting said halo layer comprises providing a thinner halo layer or eliminating said halo layer; and
   determine a third threshold voltage of a first gate-source-drain design and a fourth threshold voltage of a second gate-drain-source design and determine the thickness of a WFM layer of said second gate-drain-source design for causing said fourth threshold voltage to be within a predetermined range of said third threshold voltage.

* * * * *